United States Patent [19]

Abou

[11] Patent Number: 4,623,851

[45] Date of Patent: Nov. 18, 1986

[54] VOLTAGE CONTROLLED OSCILLATOR USING FLIP-FLOP CONTROLLED SWITCHING CIRCUITS

[75] Inventor: Shouji Abou, Kawasaki, Japan

[73] Assignee: Kabushiki Kaisha Toshiba, Japan

[21] Appl. No.: 789,094

[22] Filed: Oct. 18, 1985

[30] Foreign Application Priority Data

Oct. 27, 1984 [JP] Japan .................. 59-226156

[51] Int. Cl.$^4$ .............................................. H03B 5/24
[52] U.S. Cl. ...................................... 331/111; 331/34; 331/113 R; 331/177 R
[58] Field of Search ...................... 331/111, 34, 113 R, 331/143, 144, 177 R

[56] References Cited

U.S. PATENT DOCUMENTS

| | | | |
|---|---|---|---|
| 3,702,446 | 11/1972 | Steudel | 331/111 |
| 4,083,020 | 4/1978 | Goldberg | 331/113 R |
| 4,370,628 | 1/1983 | Henderson et al. | 331/111 |

FOREIGN PATENT DOCUMENTS

| | | | |
|---|---|---|---|
| 57-73518 | 5/1982 | Japan | 331/111 |
| 59-62215 | 4/1984 | Japan | 331/113 R |

*Primary Examiner*—Siegfried H. Grimm
*Attorney, Agent, or Firm*—Finnegan, Henderson, Farabow, Garrett & Dunner

[57] ABSTRACT

An input MOS transistor receives an input voltage and produces a current corresponding to the input voltage. A charge/discharge circuit charges a capacitor alternately in two different directions by the output current of the transistor. A select circuit alternately selects and produces one of the potentials at either of the electrodes of the capacitor. A single two-input comparator compares a reference potential with a potential of the output signal of the select circuit. The select circuit produces a signal corresponding to the comparison result. The select circuit allows the output signal of the comparator to be transmitted alternately to the set input terminal and the reset input terminal of a flip-flop. The flip-flop is set and reset by the output signal of the switch means to produce an oscillating signal. According to a change in the level of the oscillating signal, the charge/discharge circuit switches the charging direction of the capacitor. According to a change in the voltage level of the output signal of the flip-flop, the select circuit selects the potential which is higher in absolute value than the other. According to a change in the voltage level of this output signal, the switch circuit directs the output signal of the comparator to one of the set and reset input terminals of the flip-flop.

17 Claims, 19 Drawing Figures

FIG. 1 (PRIOR ART)
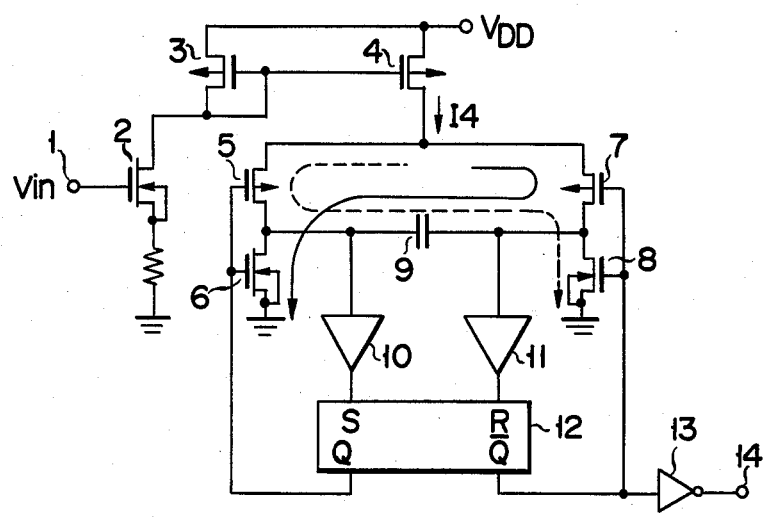
START
FIG. 3A  Q 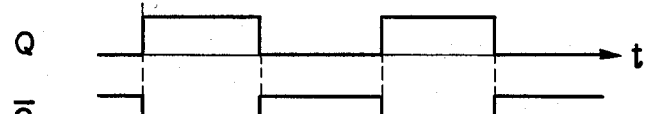
FIG. 3B  $\bar{Q}$ 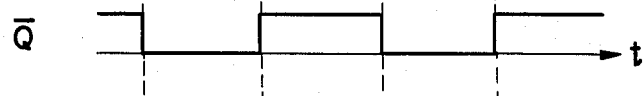
FIG. 3C  VB    — Vref
FIG. 3D  R 
FIG. 3E  VA 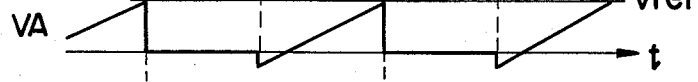   — Vref
FIG. 3F  S 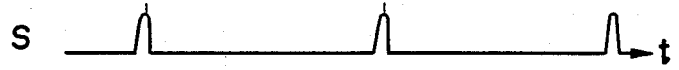

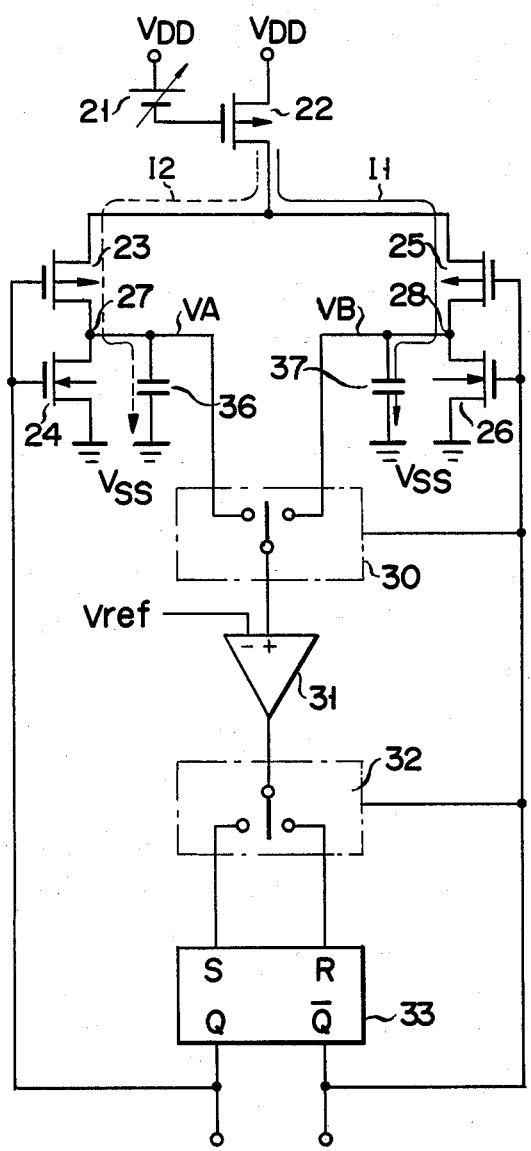
F I G. 5

F I G. 12
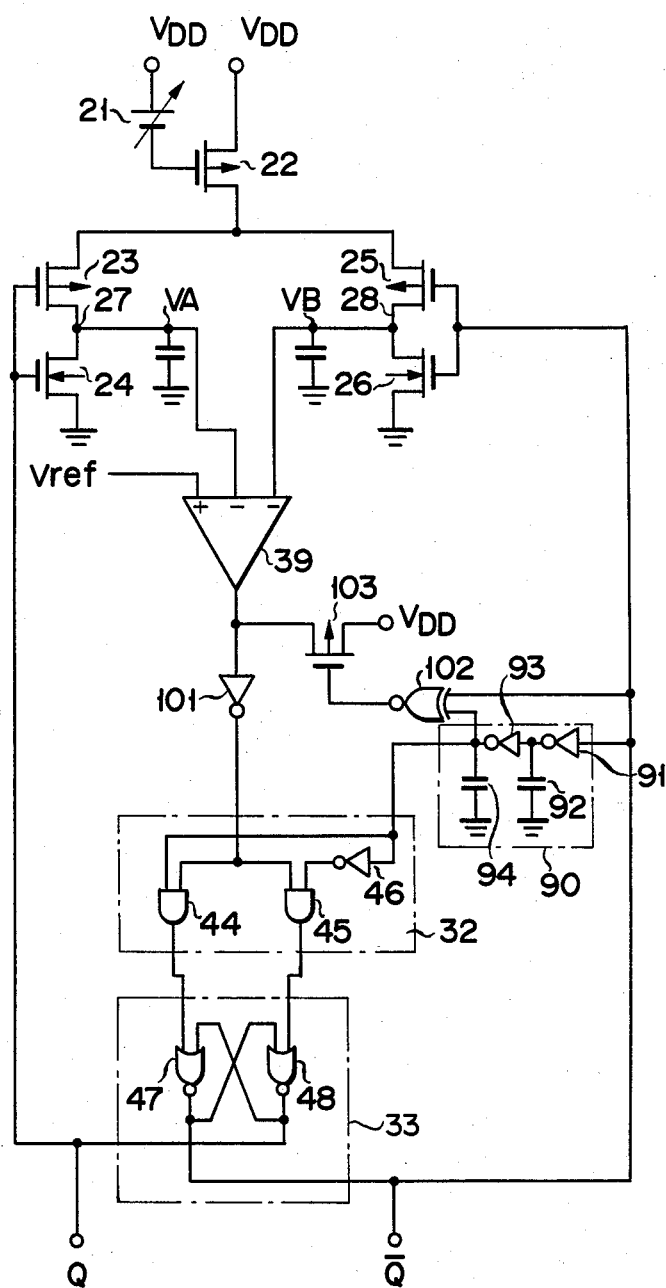

VOLTAGE CONTROLLED OSCILLATOR USING FLIP-FLOP CONTROLLED SWITCHING CIRCUITS

BACKGROUND OF THE INVENTION

This invention relates to a voltage controlled oscillator (VCO) for generating a signal with a frequency which is varied by changing an input voltage.

In a PLL (phase locked loop) frequency synthesizer, for example, it is necessary to always keep the frequency of its output signal equal to a set frequency. To realize this a VCO, for example, is used.

One of the known VCOs is disclosed and illustrated in FIGS. 1 and 3 of Japanese Kokai No. 59-62215.

The illustration of FIG. 1 shows a circuit diagram of the VCO of the Kokai. A description of the VCO follows. A current dependent on an input voltage Vin supplied to an input terminal 1 flows through an input N channel MOS transistor 2. This current also flows through a P channel MOS transistor 3. The transistor 3, together with another P channel MOS transistor 4, constitutes a current mirror circuit. The transistor 4 serves as a current source for generating a current I4 corresponding to the input voltage Vin. A capacitor 9 is bidirectionally charged through a current path including a P channel MOS transistor 5, the capacitor 9, and an N channel MOS transistor 8, which provides the current flow indicated by the dotted line, or another current path including a P channel MOS transistor 7 and an N channel MOS transistor 6, which provides the current flow indicated by the solid line. The voltage at the terminals of the capacitor 9 is applied to voltage comparators 10 and 11. The comparators 10 and 11 may, for example, be inverters or differential circuits. The output signal from the comparator 10 is applied as a set input to a flip-flop 12. The output signal of the comparator 11 is applied as a reset signal to the same flip-flop 12. The Q output signal of the flip-flop 12 controls the turning on and off of the transistors 5 and 6. The $\overline{Q}$ output signal of the flip-flop 12 controls the turning on and off of the transistors 7 and 8.

In the FIG. 1 circuit, when the Q output signal of the flip-flop 12 is logical "1", the transistors 6 and 7 are turned on. Under this condition, a current flows along the path of the solid line to charge the capacitor 9. When the potential at one end of the capacitor 9 reaches the threshold voltage level of the comparator 11, the logical state of the flip-flop 12 is inverted. Then, the Q output of the flip-flop 12 becomes "0", and the $\overline{Q}$ output becomes "1". With these logical levels, the transistors 5 and 8 are turned on. As a result, the current path indicated by the broken line is formed to charge the capacitor 9 with the current I4. When the potential at the other end of the capacitor 9 is increased to reach the threshold voltage level of the comparator 10, the logical state of the flip-flop 12 is again inverted. The logical states of the Q output and the $\overline{Q}$ output are returned to the original state.

As described above, the capacitor 9 is bidirectionally and alternately charged. The charged voltages across the capacitor 9 are compared by the comparators 10 and 11, respectively. The flip-flop 12 is controlled by each of the output signals from the comparators 10 and 11. With a repetition of the sequence of the operation steps, an output terminal 14 of an inverter 13 coupled for reception with the $\overline{Q}$ output of the flip-flop 12 provides an output signal with a frequency corresponding to the input voltage Vin.

As shown in FIG. 3 of the above Kokai, it is proposed that, in the interest of improving the operating accuracy of the circuit, a voltage controlled oscillator including a couple of capacitors be used in place of the single capacitor 9 used in the first prior example.

In the voltage controlled oscillator shown in FIG. 1, at least two types of circuits, an inverter and a differential circuit, may be used for each comparator 10 and 11. When using the inverters, the theshold values of the transistors, when manufactured, are inevitably not invariable. This results in nonuniform threshold voltage values in the manufactured inverters, an effect that holds true for oscillating frequencies of VCOs manufactured using such inverters.

In contradistinction to the inverter case, when the differential amplifiers are used for the comparators 10 and 11, a charged potential across the capacitor 9 can accurately be compared with a reference potential. The result is that the oscillating frequencies of the VCOs manufactured are free from the manufacturing process of the transistors, resulting in substantial uniformity of the oscillating frequencies. However, a constant flow of the operating current in the differential circuit brings about great power dissipation of the whole VCO. For example, when the oscillating frequency is 2 MHz, the capacitance of the capacitor 9 is 5 pF and the charged voltage of the capacitor is 2.5 V; the charging current to the capacitor is approximately 50 μA. The current consumed by each differential circuit is great; e.g. about 200 μA. For this reason, in the case of the VCO using two differential circuits, most of the power dissipation by the VCO is that of the two differential amplifiers, and its value is large.

Furthermore, the differential circuit is constructed by analog technology. The analog circuit requires that a larger area of each transistor be used than with the digital circuit; for example, the inverter and the NAND gate. This fact indicates that when the VCOs are manufactured by integration technology, the semiconductor chip used is inevitably large in size.

SUMMARY OF THE INVENTION

Accordingly, an object of the present invention is to provide a voltage controlled oscillator with a good frequency response, which is small in power dissipation, and in chip size.

To achieve the above object, there is provided a voltage controlled oscillator, comprising:

current generating means (22) for generating a current corresponding to an input voltage received thereby;

at least one capacitor means (29) for storing charges;

charge/discharge means (23 to 26) connected to the current generating means (22) and the capacitor means (29) for alternately charging the capacitor means (29) by the output current of the current generating means (22) and discharging the capacitor means (29);

comparing means (30, 31) connected to the capacitor for reception of a reference potential, the comparing means detecting charged potentials at two predetermined points of the capacitor means (29), comparing the reference signal with one of the charged potentials which is higher in absolute value than the other, and producing a signal representing the comparison result;

switch means (32) connected to the comparing means (30) and having two terminals, the switch means alternately directing the output signal from the comparing means to either of the two output terminals; and a flip-flop (33) connected to the switch means (32) and to the charge/discharge means (23, 24, 25, 26), the flip-flop being set and reset by the output signal of the switch means (32), producing an oscillating signal, and controlling the operation of the charge/discharge means (23, 24, 25, 26) and the switch means (32) by the oscillating signal.

With such an arrangement it is possible to prevent variation in the oscillating frequencies of voltage controlled oscillators, due to a variation in the characteristics of circuit elements, caused in their manufacturing stage. Therefore, the frequency of the output signal of the VCO will be exactly equal to a predetermined frequency. Further, use of a single potential detecting means dissipates much less power when compared with the prior art using two differential circuits. This feature also reduces the size of the semiconductor chip when it is fabricated into an integrated circuit.

BRIEF DESCRIPTION OF THE DRAWINGS

FIG. 1 shows the circuit diagram of a prior voltage controlled oscillating circuit;

FIGS. 3A to 3F show timing charts illustrating the operation of the voltage controlled oscillator of FIG. 2;

FIG. 5 shows the circuit diagram of the voltage controlled oscillator of the second embodiment of the present invention;

FIG. 12 shows a circuit diagram of the fifth embodiment of the voltage controlled oscillator according to the present invention.

DETAILED DESCRIPTION OF THE PREFERRED EMBODIMENTS

A voltage controlled oscillator of the first embodiment according to the present invention will be described referring to the accompanying drawings.

Figure 2:
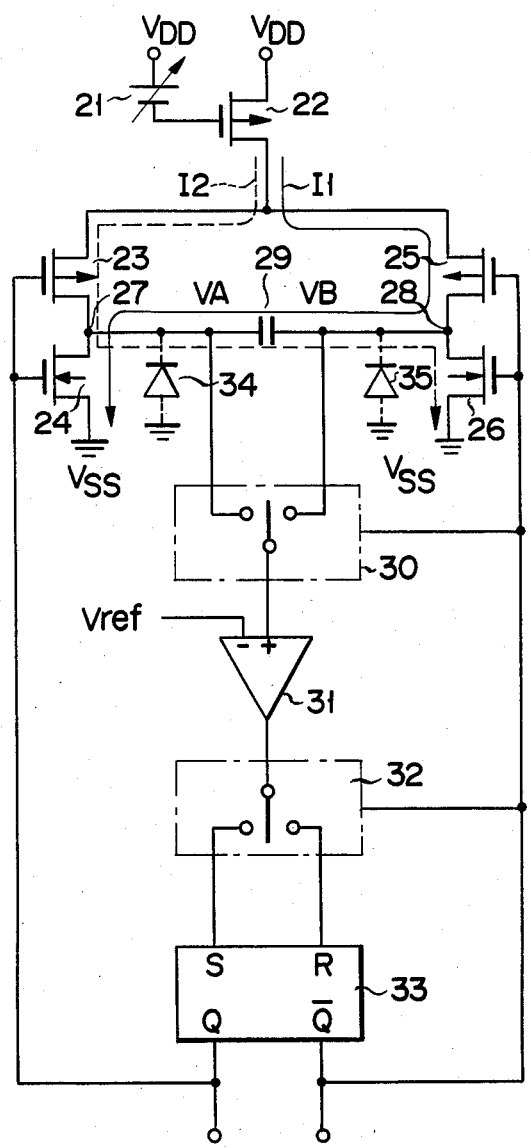
FIG. 2 shows the circuit diagram of the voltage controlled oscillator which constitutes the first embodiment of the present invention.

Reference is first made to FIG. 2, illustrating the circuit arrangement of the VCO of the first embodiment.

An output voltage Vin of an input voltage source 21 is applied to the gate of a P channel MOS transistor 22. The transistor 22 operates in the saturation region. Therefore, this transistor acts as a constant current source for providing a current corresponding to the input voltage Vin. The source of the transistor 22 is connected to a terminal coupled with a VDD power supply. The drain of the transistor 22 is connected to one end of the current path of a P channel MOS transistor 23. The other end of the current path of the transistor 23 is connected to one end of the current path of an N channel MOS transistor 24. The other end of the current path of the transistor 24 is connected to a VSS power supply. The VSS potential is equal to the ground potential, and lower than VDD. The gates of the transistors 23 and 24 are interconnected. These transistors 23 and 24 serve as switching elements.

Similarly, the drain of the transistor 22 is connected to one end of the current path of a P channel MOS transistor 25. The other end of the current path of the transistor 25 is connected to one end of the current path of an N channel MOS transistor 26. The other end of the current path of the transistor 26 is connected to the VSS. The gates of these transistors 25 and 26 are interconnected and serve as switching elements.

A node 27 between the current paths of the transistors 23 and 24 is connected to one of the electrodes of a capacitor 29. A node 28 between the current paths of the transistors 25 and 26 is connected to the other electrode of the capacitor 29. One electrode of the capacitor 29 is connected to one of the input terminals of a first select circuit 30. The other electrode of the capacitor 29 is connected to the other input terminal of the select circuit 30. The first select circuit 30, selects and outputs either potential VA at one of the electrodes of the capacitor 29, or potential VB at the other electrode, in response to a $\overline{Q}$ output signal of a flip-flop (to be given later). The output signal from the first selector 30 is connected to the noninverting input terminal of a comparator 31 of the differential type. A voltage source (not shown) constantly applies a reference voltage Vref to the inverting input terminal of the comparator 31.

The output signal of the comparator 31 is supplied to a second select circuit 32. The select circuit 32 directs, in response to the $\overline{Q}$ output signal of a flip-flop to be given later, either of two signal routes. One of the output terminals of the second select circuit 32 is connected to a set input terminal of a flip-flop 33. The other output terminal of the second select circuit 32 is connected to a reset input terminal of the flip-flop 33.

The Q output terminal of the flip-flop 33 is connected to the gates of the transistors 23 and 24. The $\overline{Q}$ output terminal of this flip-flop is connected to the gates of the transistors 25 and 26, and the control terminals of the two select circuits 30 and 32. A parasitic diode 34 of the transistor 24 is inserted between the node 27 and the Vss terminal. A parasitic diode 35 of the transistor 26 is inserted between the junction point 28 and the transistor 26.

The operation of the VCO thus arranged will be described referring to FIGS. 3A to 3F.

Let us first consider a case where the flip-flop 33 is set. In this case, the Q output signal is logical "1" and the $\overline{Q}$ output signal is logical "0", as shown in FIGS. 3A and 3B. Under this condition, the transistor 23 is turned off, the transistors 24 and 25 are turned on, and the transistor 26 is turned off. As a result, the capacitor 29 is charged by the output current I1 of the transistor 22 through the current paths of the transistors 25 and 24. The potential VB at the other electrode of the capacitor 29 increases at a constant inclination, as shown in FIG. 3C. At this time, the first select circuit 30 responds to the $\bar{Q}$ output signal ("0" level) of the flip-flop 33 to select and output the potential VB at node 28. Then, the voltage VB is supplied through the first select circuit 30 to the noninverting input terminal of the comparator 31. The second select circuit 32 responds to the $\bar{Q}$ output signal ("0" level) of the flip-flop 33 to direct the output signal of the comparator 31 to the reset terminal of the flip-flop 33.

When the potential VB reaches the reference potential Vref, the comparator 31 produces a high (H) level signal, as shown in FIG. 3D. This H level signal R is input to the reset terminal. Therefore, when the output signal of the comparator 31 becomes H in level, the flip-flop 33 is reset. The flip-flop 33, after being reset, produces a logical "0" at the Q output and a logical "1" at the $\bar{Q}$ output.

In response to the Q and $\bar{Q}$ signals, the transistor 23 is turned on, the transistors 24 and 25 are turned off, and the transistor 26 is turned on. Therefore, the capacitor 29 is discharged through the transistor 26 and the potential VB is equal to the ground potential. Further, both the output signal of the comparator 31, and the reset signal R are also low (L) in level, as shown in FIG. 3D. The capacitor 29 is charged though the current paths of the transistors 23 and 26 of the output current of the transistor 22, as indicated by the broken line with an arrow head denoted as I2.

Prior to this charging, node 28, which has been charged at a high potential in the previous set period, is discharged through the turned on transistor 26 and the parasitic diode 35. Therefore, immediately after the transistor 26 is turned on, the potential VB at the junction point 28 is placed at potential VSS. The potential VA at node 27 is placed at a potential lower than potential VSS by the forward voltage VF of the diode 34. Afterwards, like the voltage VB, the voltage VA at the other terminal of the capacitor 29; i.e., node 26 between the transistors 23 and 27, increases from a negative potential (−VF) at a constant inclination, as shown in FIG. 3E. At this time, the first select circuit 30 selects the potential VA by the $\bar{Q}$ output signal. Also at this time, the second select circuit 32, responsive to the $\bar{Q}$ output signal of the flip-flop 33, supplies the output signal of the comparator 31 as a set signal S to the flip-flop 33. Therefore, when the potential VA reaches the reference potential Vref and the output signal of the comparator 31 becomes H in level, a set signal S as shown in FIG. 3F is input to the flip-flop 33. Therefore, the flip-flop 33 is set, so that the Q output signal of the flip-flop 33 is logical "1" and the $\bar{Q}$ signal is logical "0". In response to the Q signal and the $\bar{Q}$ signal, the transistor 23 is turned off and the transistors 24, 25 and 26 are turned on. As a result, the capacitor 29 is discharged and the potential VA equals VSS. Then, the capacitor 29 is charged through the current paths of the transistors 25 and 24 by the current indicated by the continuous line denoted as I1. As charging progresses, the potential VB gradually increases.

Subsequently, an operation similar to that given above will be repeated, so that the Q output signal and the $\bar{Q}$ output signal of the flip-flop 33 change their logical states at predetermined periods. In other words, the flip-flop 33 produces a signal oscillating at a predetermined frequency.

The frequency f of this oscillating signal is given by $$f\,\text{Hz} = 1/\{2\cdot C\cdot(V\text{ref}+VF)\}\text{Hz} \quad (1)$$

where I is the current, corresponding to the input voltage Vin, flowing through the transistor 22, and C is the capacitance of the capacitor 29.

The equation (1) shows that the frequency of the oscillating signal is proportional to the current I corresponding to the input voltage Vin. Thus, the circuit arranged as shown in FIG. 2 operates as a voltage controlled oscillator.

In the present embodiment, the charged potentials VA and VB across the capacitor 29 are compared with the reference potential Vref by the comparator of the differential type. Because of this feature, the voltage controlled oscillator of the present embodiment is free from variation in the oscillating frequency due to the characteristic variations caused in the manufacturing process. Accordingly, the VCO can produce an oscillating signal of an exact frequency. Further, since only one comparator is used, the power dissipation of the VCO is remarkably reduced when compared with that of the prior art using two differential circuits. The feature of the single comparator further reduces the chip size, improving the circuit density when it is IC fabricated.

Figure 4:
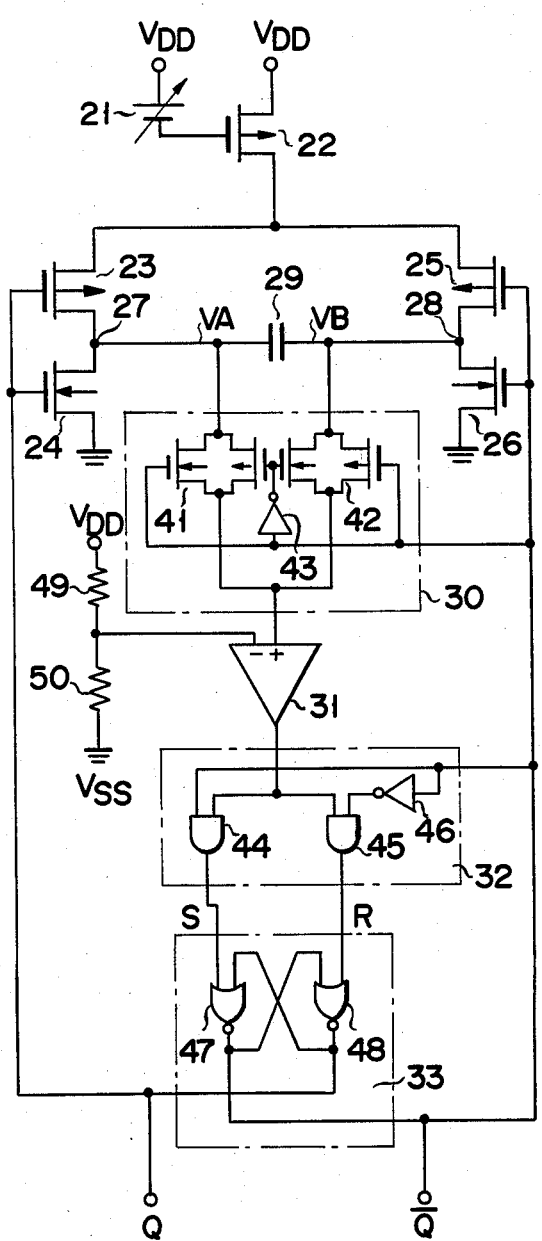
FIG. 4 shows the circuit diagram of the voltage controlled oscillator shown in FIG. 2.

The detailed circuit arrangements of the first and second select circuits 30 and 32, the flip-flop 33, and the circuit for producing the reference potential Vref, will be described referring to FIG. 4. FIG. 4 is a circuit diagram of the VCO, illustrating the details of the select circuits 30 and 32, the flip-flop 33, and the Vref producing circuit.

The first select circuit 30 is comprised of a couple of CMOS switches 41 and 42, and an inverter 43. The switches 41 and 42 are each made up of parallel coupled transistors: one is an N channel MOS transistor and the other is a P channel MOS transistor. The switch 41 is inserted between node 27 and the noninverting input terminal of the comparator 31. The switch 42 is inserted between node 28 and the noninverting input terminal of the comparator 31. The $\bar{Q}$ signal is supplied to the input terminal of the inverter 43. The output signal of the inverter 43 and the $\bar{Q}$ signal are supplied as control signals to the switches 41 and 42. When the $\bar{Q}$ output signal of the flip-flop 33 is logical "1", the MOS switch 41 is turned on. Therefore, the potential VA is supplied to the comparator 31 by way of the switch 41. When the $\bar{Q}$ output signal of the flip-flop 33 is logical "0", the switch 42 is turned on and the potential VB is supplied to the comparator 31.

The second select circuit 32 is comprised of two AND gates 44 and 45, and an inverter 46. The output signal of the comparator 31 is supplied to the first input terminals of the AND gates 44 and 45. The $\bar{Q}$ output signal of the flip-flop 33 is supplied to the second input terminal of the AND gate 44. The $\bar{Q}$ output signal of the flip-flop 33 is input to the second input terminal of the AND gate 45 through an inverter 46. The output terminal of the AND gate 44 is connected to the set input terminal of the flip-flop 33. The output terminal of the AND gate 45 is connected to the reset input terminal of the flip-flop 33. When the $\bar{Q}$ output signal of the flip-flop 33 is logical "1", the AND gate 44 is enabled. The output signal of the comparator 31 is supplied to the set input terminal of the flip-flop 33. When the $\bar{Q}$ signal of the flip-flop 33 is logical "0", the AND gate 45 is enabled. The output signal of the comparator is input to the reset input terminal.

The flip-flop 33 is comprised of a couple of NOR gates 47 and 48 cross coupled with each other, as shown. The output signal of the AND gate 44 in the select circuit 32 is supplied as a set signal to one of the input terminals of the NOR gate 47. The output signal of the AND gate 45 in the select circuit 32 is supplied as a reset signal to one of the input terminals of the NOR gate 48. The output signal of the NOR gate 47 is output as a $\overline{Q}$ output signal. The output signal of the NOR gate 48 is produced as a Q output signal.

The circuit for producing the reference voltage is comprised of two resistors 49 and 50 connected in series with each other. These resistors are connected between the VDD and VSS supplies. The resistors 49 and 50 divide the voltage VDD by the resistance ratio of their resistors. The reference voltage Vref is derived from the node between the resistors 49 and 50.

Turning now to FIG. 5, there is shown a voltage controlled oscillator according to the second embodiment of the present invention. In FIG. 5, like reference symbols are applied to like or equivalent portions in FIG. 2. The second embodiment is different from the first embodiment in that two capacitors 36 and 37 are used in place of the single capacitor 29. One electrode of the capacitor 36 is connected to node 27 between the transistors 23 and 24. The other electrode of the capacitor 36 is connected to the VSS. One of the electrodes of the capacitor 37 is connected to node 28 between the transistors 25 and 26. The other electrode of the capacitor 37 is connected to the VSS terminal.

The potential at the node between the capacitor 36 and node 27 is applied as the potential VA to the first select circuit 30. The potential at the node between the capacitor 37 and node 28 is applied as the potential VB to the first select circuit 30.

The operation of the VCO of this embodiment is similar to that of the first embodiment.

Let us assume that the flip-flip 33 is set. In this state, the capacitor 37 is charged. With this charge, the potential VB at the other electrode of the capacitor 37 increases linearly, as shown in FIG. 3C. At this time, the first select circuit 30 selects and outputs the potential VB at node 28. The potential VB is applied through the first select circuit 30 to the noninverting input terminal of the comparator 31. In response to the $\overline{Q}$ signal, the second select circuit 32 outputs the output signal of the comparator 31 to the reset terminal of the flip-flop 33.

When the potential VB increases and is higher than the reference potential Vref, the comparator 31 produces a signal at an H level. This H level signal is input to the reset terminal. Thus, when the output signal of the comparator 31 becomes high in level, the flip-flop 33 is reset.

In response to the Q signal and the $\overline{Q}$ signal from the flip-flop 33, the transistor 23 is turned on, the transistors 24 and 25 are turned off, and the transistor 26 is turned on. The capacitor 37 is discharged through the current path of the transistor 26, and the capacitor 36 is charged by the current I2, whose flow is indicated by the broken line with an arrow head.

As shown, the other electrodes of the capacitors 36 and 37 are grounded. With the grounding, when the capacitors 36 and 37 are discharged through the transistors 24 and 26, one end of each discharge path is reliably fixed at the ground potential. In other words, unlike the first embodiment of FIG. 2, the second embodiment is little potential-influenced in operation by the capacitances parasitic to the transistors 25 and 26. Accordingly, if the capacitances of the capacitors C1 and C2 are both C, the equation (1) representing the oscillating frequency of the VCO, can be rewritten as $$f\,Hz = 1/(2 \cdot C \cdot Vref)\ Hz \qquad (2)$$

As shown, the equation (2) does not include the factor of VF. This indicates that the oscillating frequency can be controlled accurately.

Figure 6:
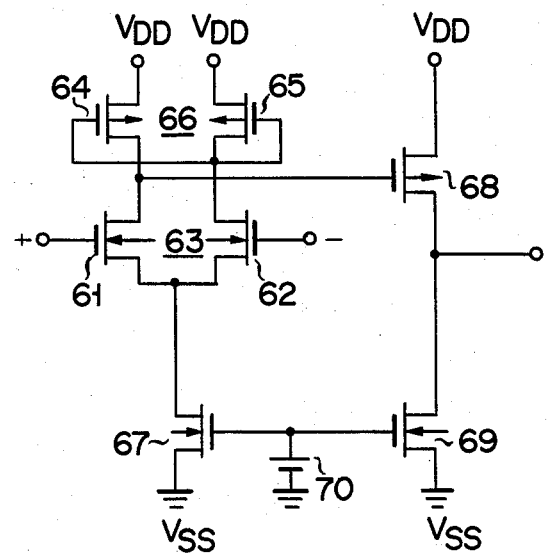
FIGS. 6 and 7 show circuit diagrams of comparators which may be used in the voltage controlled oscillators of FIGS. 2 and 5.

A first embodiment of the comparator 31 which may be used for the first and second embodiments of the VCO, will be given referring to FIG. 6. One end of the current path of an N channel MOS transistor 61 is connected to one end of the current path of an N channel MOS transistor 62. These transistors 61 and 62 form a differential pair 63. The other end of the current path of the transistor 61 is connected to one end of the current path of a P channel MOS transistor 64. The other end of the current path of the transistor 64 is connected to the VDD. The other end of the current path of the transistor 62 is connected to one end of the current path of a P channel MOS transistor 65. The other end of the current path of the transistor 65 is connected to the VDD. The gates of the transistors 64 and 65 are connected to the node between the transistors 62 and 65. These transistors 64 and 65 form a current mirror circuit 66 as a load of the differential pair 63.

The node between the current paths of the transistors 61 and 62 is connected to one end of the current path of an N channel MOS transistor 67. The other end of the current path of the transistor 67 is connected to the VSS. The transistor 67 is a constant current source for providing an operating current to the differential amplifier pair 63. The connection point between the transistors 61 and 64 is connected to the gate of a P channel MOS transistor 68. The output signal of the differential pair 63 is supplied t the gate of the transistor 68. One end of the current path of the transistor 68 is connected to the VDD. The other end of the current path of the transistor 68 is connected to one end of the current path of an N channel MOS transistor 69 as a current load of the transistor 68. The gate of the transistor 69 is connected to the gate of the transistor 67. The other end of the current path of the transistor 69 is grounded. A DC voltage source 70 is coupled with the gates of the transistors 67 and 69, and applies a fixed bias voltage to these transistors.

The gate of the transistor 61 serves as a noninverting input terminal of the differential pair 63, which is coupled for reception with the output signal of the first select circuit 30. The gate of the transistor 62 serves as an inverting input terminal of the differential pair, which is coupled for reception with the reference potential Vref. The output signal of the comparator 31 is derived from a connection point between the transistors 68 and 69.

Figure 7:
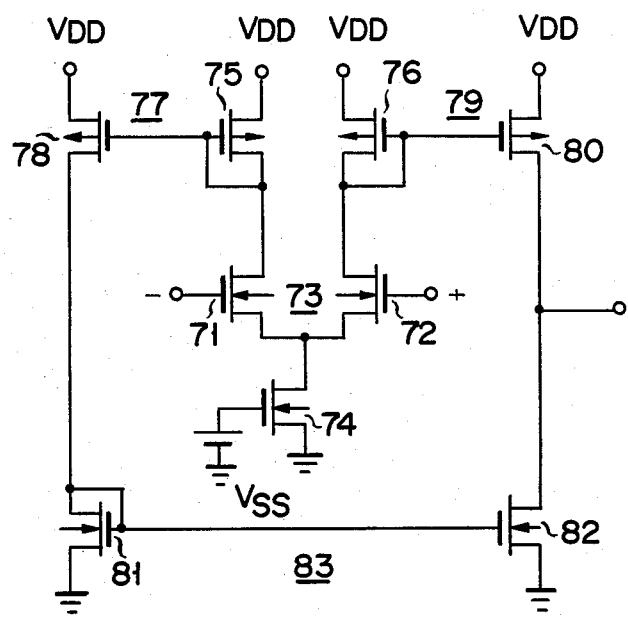

A second embodiment of the comparator will be described referring to FIG. 7. As shown, one end of the current path of an N channel MOS transistor 71 is connected to one end of the current path of an N channel MOS transistor 72. The transistors 71 and 72 form a differential amplifier pair 73. One end of the current path of an N channel MOS transistor 74 is connected to the node of the current paths of the transistors 71 and 72. The other end of the current path of the transistor 74 is connected to the VSS. A fixed voltage is applied to the gate of the transistor 74. The other end of the current path of the transistor 71 is connected to one end of the current path of a P channel MOS transistor 75, and the gate of the transistor 75. The other end of the current path of the transistor 75 is coupled with the VDD. The other end of the current path of the transistor 72 is connected to one end of the current path of a P channel MOS transistor 76, and the gate of the same transistor. The other end of the current path of the transistor 76 is connected to the VDD. A P channel MOS transistor 78, which is connected at the gate to the gate of the transistor 75, forms a current mirror circuit 77 together with the transistor 75. The gate of a P channel MOS transistor 80 is connected to the gate of the transistor 76, and forms a current mirror circuit 79 together with the transistor 76. One end of the current path of each transistor 78 and 80 is coupled with the VDD. The other end of the current path of the transistor 78 is connected to one end of the current path of an N channel MOS transistor 81 and the gate of the same transistor. The other end of the transistor 81 is connected to the VSS. The other end of the current path of the transistor 80 is connected to one end of the current path of an N channel MOS transistor 82. The other end of the current path of the transistor 82 is connected to the VSS. The gate of the transistor 82 is connected to the gate of the transistor 81. These transistors 81 and 82 form a current mirror circuit 83.

The gate of the transistor 72 serves as a noninverting input terminal to which the output potential of the first select circuit 30 is applied. The gate of the transistor 71 is used as an inverting input terminal to which the reference voltage Vref is applied. The output signal of the comparator 31 is derived from the node of the transistors 80 and 82.

A third embodiment of the VCO according to the present invention will be described referring to FIG. 8. In the figure, like reference numerals are used to designate like or equivalent portions in FIG. 2. The difference between the third and first embodiments resides in that the first select circuit 30 and the differential type comparator 31 are removed and a differential type comparator 38 with two noninverting input terminals and a single inverting input terminal is additionally used.

The comparator 38 with three inputs is so constructed that, of the two potentials applied to the two noninverting input terminals, the higher potential is compared with the reference potential Vref applied to the inverting input terminal. The two noninverting input terminal are coupled for reception with the potentials VA and VB at both ends of the capacitor 29. The output signal of the comparator 38 is connected to the second select circuit 32.

As in the first embodiment, the capacitor 29 is charged through either the pair of transistors 24 and 25 or the pair of transistors 23 and 26. With this connection, the potential at one end of the capacitor is higher than that at the other end. The higher potential is compared with the reference potential. Accordingly, the operation of this embodiment can be time charted as shown in FIGS. 3A to 3F.

A detailed circuit arrangement of the three-input comparator 38 used in the FIG. 8 VCO will be described referring to FIG. 9. The circuit arrangement of FIG. 9 is equivalent to the FIG. 6 comparator with additional transistors 84 and 85. The current path of the N channel MOS transistor 84 is parallel coupled with the current path of the N channel MOS transistor 61, while the current path of the N channel MOS transistor 85 is parallel coupled with the current path of the N channel MOS transistor 62. The gate of the transistor 84 is used as the additional noninverting input terminal. The gate of the transistor 85 is fed with a fixed bias voltage Vm. The transistor 85 is not essential to the comparator 38, and hence may be omitted.

In this circuit, when the gate input potential of the transistor 84 is at the earth potential, the transistor 84 is completely turned off. Accordingly, the transistors 61 and 62 operate at a differential circuit and the gate input potentials are compared with each other. When the gate input potential of the transistor 61 is equal to the earth potential, the transistors 84 and 62 form a differential circuit.

The transistor 84 acts as a limiter of the potential at the inverting input terminal. When a potential of Vm or more is applied to the gate of the transistor 62, no current flows through the transistor 85, and therefore the transistor 84 does not act on the potential at the inverting input terminal. When the gate potential of the transistor 62 is below Vm, the transistor 62 is turned off and behaves as though the Vm had been applied to its gate.

Figure 10:
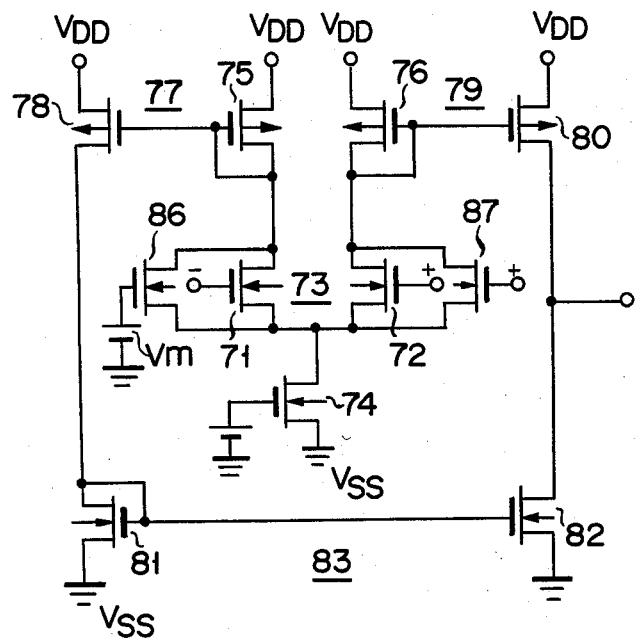

A second embodiment of the three-input comparator 38, which is used in the FIG. 8 circuit, will be described referring to FIG. 10. The circuit arrangement shown in FIG. 10 corresponds to the FIG. 7 circuit arrangement having additional N channel MOS transistors 86 and 87. The current path of the transistor 86 is connected in parallel to the current path of the transistor 71. The current path of the transistor 87 is connected to the current path of the transistor 72 in parallel. The gate of the transistor 87 is used as the additional noninverting input terminal. The gate of the transistor 86 is biased by a fixed voltage bias source Vm. The transistor 86 is omissible because it is not essential to the comparator.

A VCO according to the fourth embodiment of the present invention will be described.

Figure 8:
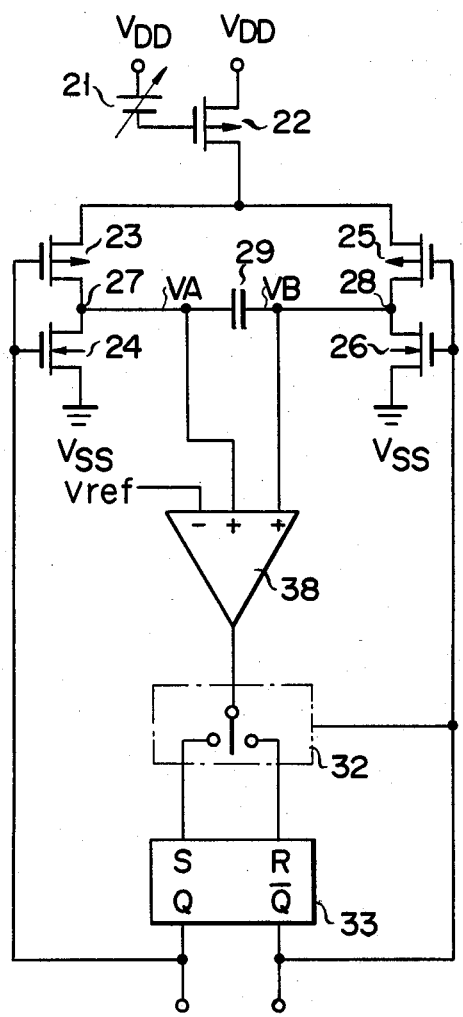
FIG. 8 shows a circuit diagram of the voltage controlled oscillator which constitutes the third embodiment of the present invention.
Figure 9:
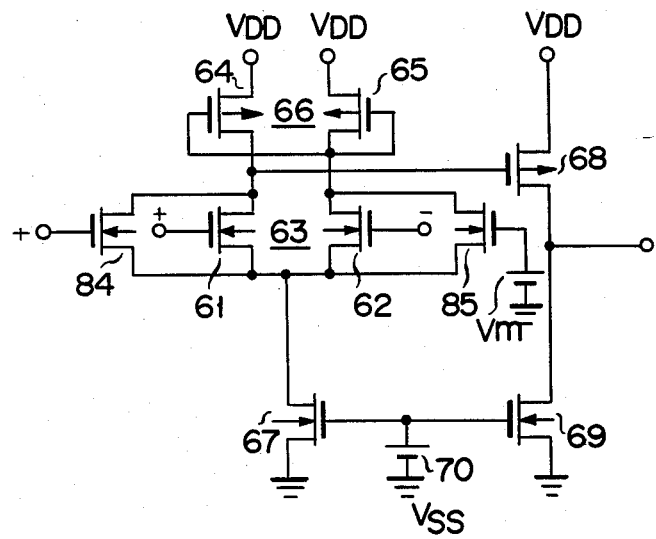
FIGS. 9 and 10 show circuit diagrams of comparators which may be used in the voltage controlled oscillator of FIG. 8.

A signal time delay is inevitably involved in the comparators 31 and 38 shown in FIGS. 2, 5 and 8. Because of the presence of the time delay, immediately after a logical state of the flip-flop 33 is inverted, the flip-flop 33 is occasionally returned to the original logical state. Let us assume that in FIG. 8, the flip-flop 33 is set. At this time, the Q output signal of the flip-flop 33 is logical "1" and the $\overline{Q}$ signal is logical "0". Accordingly, the transistors 24 and 25 are turned on, so that the capacitor 29 is charged to gradually increase the potential VB. When the potential VB reaches the reference potential Vref, the output signal of the comparator 38 changes its logical level from L level to H level. At this time, the second select circuit 32 supplies the output signal of the comparator 38 to the reset terminal of the flip-flop 33. Immediately after the supply of the reset signal, the flip-flop 33 is reset. The result is that the $\overline{Q}$ output signal becomes H in level to drive the select circuit 32 for switching. In the operating speed, the differential type comparator is generally slower than the digital circuits. For this reason, immediately after the flip-flop 33 is reset, the duration of the logical "1" state of the output signal of the comparator 38 lasts for a short while. By the select circuit 32, therefore, the output signal still in the logical "1" state of the comparator 38 is supplied to the set terminal of the flip-flop 33. As a result, the flip-flop is set again. In this way, the logical state of the flip-flop 33 is repeatedly inverted without regard to the potentials VA and VB. Such an operation of the flip-flop 33 ia abnormal.

Figure 11:
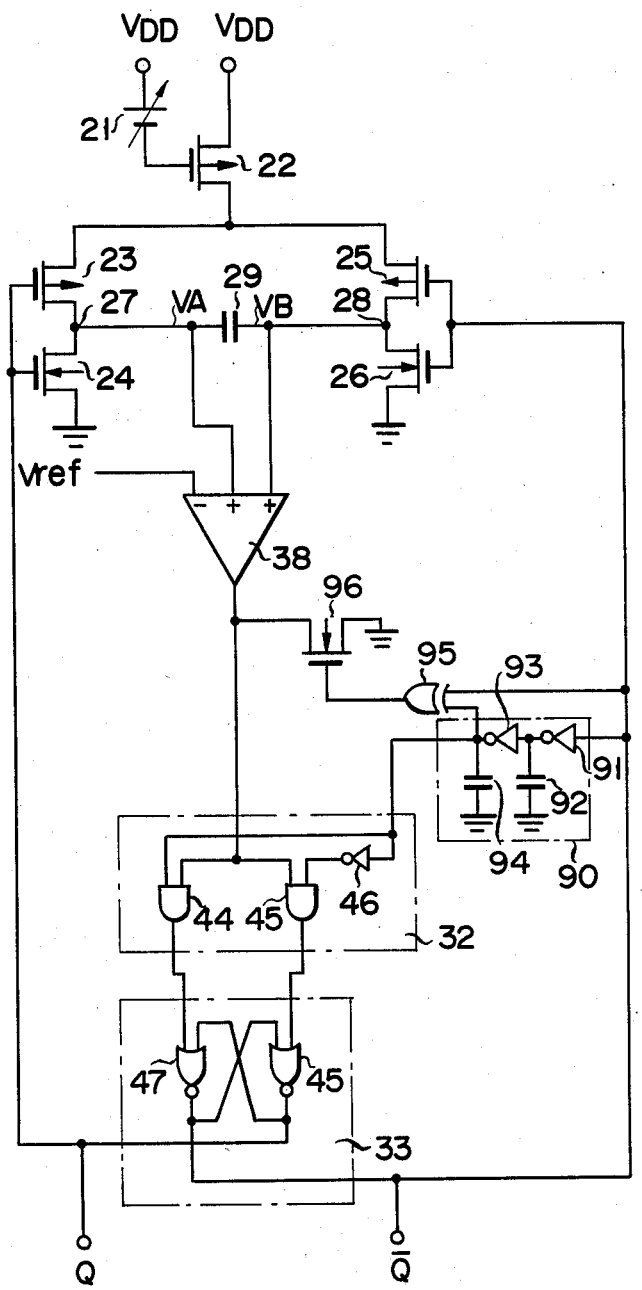
FIG. 11 shows the circuit diagram of the fourth embodiment of the voltage controlled oscillator according to the present invention.

To prevent abnormal operation of the flip-flop 33 due to the signal delay by the comparator, the present embodiment shown in FIG. 11 additionally uses a delay circuit 90, an exclusive OR gate 95, and an N channel MOS transistor 96. The delay circuit 90 delays the $\overline{Q}$ output signal of the flip-flop 33. The delay time of the circuit 90 is not less than the signal delay time in the comparator 38. The exclusive OR gate 95 is coupled for reception with the output signal of the delay circuit 90 and the $\overline{Q}$ output signal of the flip-flop 33. The N channel MOS transistor 96 is so connected that its current path is inserted between the output terminal of the comparator 38 and the VSS supply, and its gate is coupled for reception with the output signal of the exclusive OR gate 95.

The delay circuit 90 is comprised of an inverter 91 for receiving the $\overline{Q}$ output signal of the flip-flop 33, a capacitor 92 connected between the output terminal of the inverter 91 and the VSS, another inverter 93 coupled for reception with the output signal of the inverter 91, and a capacitor 94 connected between the output terminal of the inverter 93 and the VSS. The output signal of the inverter 93 is supplied as a delay signal to the select circuit 32 and the exclusive OR gate 95.

The operation of the VCO shown in FIG. 11 will be described. It is assumed that the flip-flop 33 is set with its Q output signal being logical "1" and its $\overline{Q}$ output signal being logical "0". Under this condition, the transistors 24 and 25 are turned on. Therefore, the capacitor 29 is charged and the potential VB is gradually raised. When the potential VB reaches the reference potential Vref, the output signal of the comparator 38 inverts its level from L level to H level. Subsequently, the select circuit 32 supplies the output signal of the comparator 38 to the reset terminal. Upon receipt of this reset signal, the flip-flop 33 is reset and the $\overline{Q}$ signal is inverted, in its logical state, into logical "1". The Q signal is delayed by a predetermined period of time by the delay circuit 90 and supplied to the select circuit 32. Therefore, the select circuit 32 is not switched until the input potential at the noninverting input terminal of the comparator 38 is of a low potential, and the output signal drops to a low level. Immediately after the flip-flop 33 is reset and the $\overline{Q}$ signal is inverted to logical "1", the output signal of the delay circuit 90 is still logical "0". At this time, the output signal of the exclusive OR gate 95 is in logical "1" and the transistor 96 is in an On state. Under this condition, the output signal of the comparator 38 is forcibly set at a low level by the transistor 96.

Thus, in this embodiment, after the logical state of the flip-flop 33 is inverted, the output signal of the comparator 38 is forced to be of a low level for the signal delay time of the delay circuit 90. Then, the select circuit 32 is switched. In this way, an erroneous operation of the flip-flop 33 can be prevented.

A VCO according to the fourth embodiment of this invention will be described referring to FIG. 12. In FIG. 12, like reference symbols designate like or equivalent portions in FIGS. 5 and 11. Major differences of the FIG. 12 circuit from the FIG. 11 circuit will be elucidated. A couple of capacitors 36 and 37 are used in place of the single capacitor 29. The three-input diferential type comparator 38 with the two noninverting input terminals and the single inverting input terminal is substituted by a three-input differential type comparator 39 with two inverting input terminals and one noninverting input terminal. The output signal of the comparator 39 is supplied through an inverter 101 to the select circuit 32. The exclusive OR gate 95 is replaced by exclusive NOR gate 102 and the N channel MOS transistor 96 is replaced by a P channel MOS transistor 103.

The P channel MOS transistor 103 is placed between the output terminal of the comparator 39 and the VDD supply.

Figure 13:
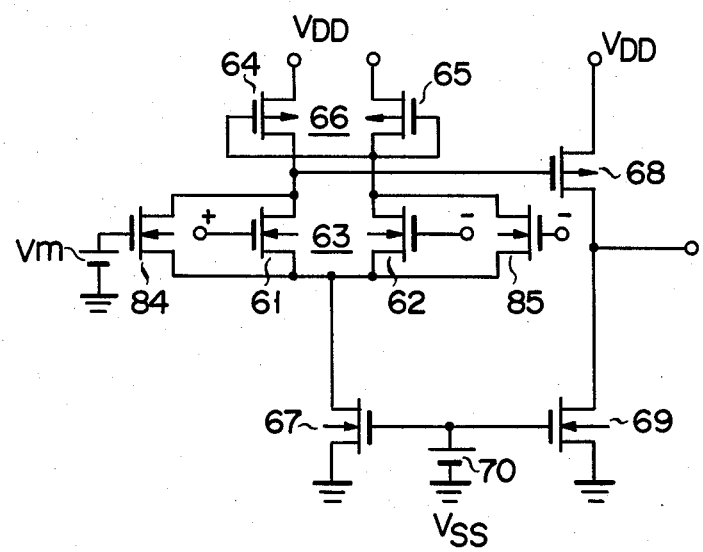
FIGS. 13 and 14 show circuit diagrams of comparators which may be used in the voltage controlled oscillators of FIGS. 11 and 12.

A detailed circuit arrangement of the three-input differential type comparator 39, which may be used in the fifth embodiment, will be given referring to FIG. 13. This comparator has substantially the same circuit arrangement as that of FIG. 9. In FIG. 13, the fixed bias source Vm is connected to the gate of the transistor 84, not the transistor 85. The gate of the transistor 61 is used as a noninverting input terminal, and the gates of the transistors 62 and 85 are used as the inverting input terminals.

Figure 14:
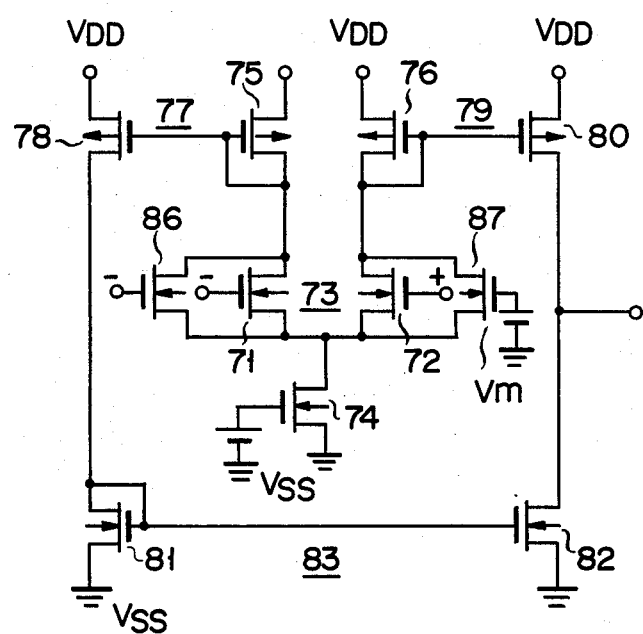

A second embodiment of the comparator, which can be used in the FIG. 12 VCO, will be described referring to FIG. 14. This comparator has substantially the same arrangement as that of FIG. 10. In FIG. 14, the bias source Vm is coupled with the gate of the transistor 87, not the transistor 86. The gate of the transistor 72 serves as a noninverting input terminal, and the gates of the transistors 71 and 86 serve as inverting input terminals.

In FIGS. 13 and 14, the transistors 84 and 87 are ommissible because these are not essential to the comparator.

It should be understood that the present invention is not limited to the above-mentioned embodiments, but may be variously modified and changed within the scope of the present invention. For example, the third to fifth embodiments may be modified to an arrangement using two capacitors. Further, the polarities of the respective transistors may be inverted in connection. In this case, the VDD an the VSS are interchanged.

What is claimed is:

1. A voltage controlled oscillator comprising:
   current producing means for producing current corresponding to an input voltage applied thereto;
   at least one capacitor means for storing charges;
   charge/discharge means connected to said current producing means and said capacitor means for alternately charging said capacitor means by the output current of said current producing means and discharging said capacitor means;
   comparing means coupled with a reference potential and said capacitor means for detecting potentials at two predetermined points of said capacitor means, said comparing means comparing said reference potential with one of said detected potentials, which is higher in absolute value than the other, to produce a signal corresponding to the comparison result;
   switch means having two output terminals and connected to said comparing means for producing the output signal of said comparing means alternately at one of said two output terminals; and
   a flip-flop connected to said switch means and said charge/discharge means, said flip-flop being set and reset by the output signal of said switch means to produce an oscillating signal by which the operation of said charge/discharge means is controlled.

2. A voltage controlled oscillator according to claim 1, in which said capacitor means has two electrode terminals, and said charge/discharge means charges said capacitor means alternately in different directions according to a change in the level of the received output signal of said flip-flop.

3. A voltage controlled oscillator according to claim 1, in which said capacitor means includes first capacitor means and second capacitor means, and said charge/discharge means alternately charges said first and second capacitor means according to a change in the level of the output signal of said flip-flop.

4. A voltage controlled oscillator according to claim 2, in which said comparing means includes select means connected to said flip-flop for alternately selecting one of the potentials at either of the electrodes of said capacitor means, according to a change in the level of the output signal of said flip-flop, to produce the select means output signal;
a comparing circuit connected to said select means for comparing said reference potential with the potential of the output signal of said select means.

5. A voltage controlled oscillator according to claim 2, in which said comparing means includes a three-input comparing circuit for comparing said reference voltage with one of the potentials, which is higher in absolute value than the other, at either of the electrodes of said capacitor, and for producing a signal corresponding to the comparison result.

6. A voltage controlled oscillator according to claim 3, in which said comparing means includes select means connected to said flip-flop for alternately selecting one of the potentials across said first and second capacitor means according to a level change in the output signal of said flip-flop, and for producing the selected potential; as well as a comparing circuit connected to said select means for comparing said received reference potential with the potential of the output signal of said select means.

7. A voltage controlled oscillator according to claim 3, in which said comparing means includes a threeinput comparing circuit for comparing said reference potential with one of the potentials, which is higher in absolute value than the other, across said first and second capacitor means, and for producing a signal corresponding to the comparison result.

8. A voltage controlled oscillator according to claim 1, in which said voltage controlled oscillator further includes delay means connected to said switch means and said flip-flop for delaying the output signal of said flip-flop by a predetermined time, and for supplying the delayed signal to said switch means; and means connected to said comparing means and said delay means for retaining, at a predetermined potential, the potential of the output signal of said comparing means during the delay period of said delay means.

9. A voltage controlled oscillator according to claim 1, in which said current producing means includes a MOS transistor of which the current path is coupled at one end to a predetermined voltage and at the other end to said charge/discharge means, and of which the gate is coupled for reception with said input voltage; said MOS transistor operating in a saturation region.

10. A voltage controlled oscillator comprising:
current producing means for producing a current corresponding to an input voltage applied thereto;
capacitor means with two electrode terminals for storing charges;
charge means coupled for reception with a control signal, and connected to said current producing means and said capacitor means, said charge means charging said capacitor means alternately from either of the two electrodes of said capacitor by the output current of said current producing means in accordance with a level change of said control signal;
comparing means coupled for reception with a reference potential and connected to said capacitor means for detecting potentials at said electrodes of said capacitor means, said comparing means comparing said reference potential with one of said detected potentials, which is higher in absolute value than the other, to produce a signal corresponding to the comparison result;
switch means having first and second output terminals connected to said comparing means and connected for reception to said control signal, said switch means providing the output signal of said comparing means alternately at either of said first and second output terminals according to a level change in said control signal; and
a flip-flop with set and reset terminals connected to said charge means and said switch means, said set terminal being connected to said first output terminal of said switch means, and said reset terminal being connected to said second output terminal; said flip-flop being set and reset by the output signal of said switch means to produce an oscillating signal which is supplied in turn as said control signal to said charge means, said comparing means and said switch means.

11. A voltage controlled oscillator according to claim 10, in which said comparing means includes select means connected to said flip-flop for alternately selecting one of the potentials at either of the electrodes of said capacitor means according to a change in the level of the output signal of said flip-flop, and for outputting the selected potential; and a comparing circuit connected to said select means and coupled for reception with said reference potential, said comparing circuit comparing the potential of the output signal of said select means with said reference potential.

12. A voltage controlled oscillator according to claim 10, in which said comparing circuit includes a three-input comparing circuit coupled for reception with potentials at said two electrode terminals of said capacitor means; said three-input comparing circuit compares said reference potential with one of the potentials which is higher in absolute value than the other, and produces a signal corresponding to the comparison result.

13. A voltage controlled oscillator according to claim 10, further comprising delay means connected to said flip-flop for delaying the output signal of said flip-flop by a predetermined time and supplying the delayed signal to said switch means;
means connected to said comparing means and said delay means for retaining, at a predetermined potential, the output signal of said comparing means during the delay period of said delay means.

14. A voltage controlled oscillator comprising:
current producing means for producing a current corresponding to an input voltage applied thereto;
first and second capacitor means for storing charges;
charge/discharge means coupled for reception with a control signal, and connected to said current producing means and said first and second capacitor means, said charge/discharge means alternately charging said first and second capacitor means by the output current of said current producing means in accordance with a change in the level of said control signal, one of said first and second capacitor means being charged while the other being discharged;

comparing means coupled for reception with a reference potential and connected to said capacitor means for detecting potentials of said first and second capacitor means, said comparing means comparing said reference potential with one of said detected potentials, which is higher in absolute value than the other, to produce a signal corresponding to the comparison result;

switch means having first and second output terminals connected to said comparing means and connected for reception to said control signal, said comparing means providing the output signal of said comparing means alternately at either of said first and second output terminals according to a change in the level of said control signal; and a flip-flop with set and reset terminals connected to said charge/discharge means and said switch means, said set terminal being connected to said first output terminal of said switch means, and said reset terminal being connected to said second output terminal; said flip-flop being set and reset by the output signal of said switch means to produce an oscillating signal which is supplied in turn as said control signal to said charge/discharge means, said comparing means and said switch means.

15. A voltage controlled oscillator according to claim 14, in which said comparing means includes select means connected to said flip-flop for alternately selecting one of the potentials at either of said first and second capacitor means according to a change in the level of the output signal of said flip-flop, and for outputting the selected potential; and a comparing circuit connected to said select means and coupled for reception with said reference potential, said comparing circuit comparing the potential of the output signal of said select means with said reference potential.

16. A voltage controlled oscillator according to claim 14, in which said comparing circuit includes a three-input comparing circuit coupled for reception with potentials at said first and second capacitor means, said three-input comparing circuit compares said reference potential with the potential which is higher in absolute value than the other, and produces a signal corresponding to the comparison result.

17. A voltage controlled oscillator according to claim 14, further comprising delay means connected to said flip-flop for delaying the output signal of said flip-flop by a predetermined time and supplying the delayed signal to said switch means;

means connected to said comparing means and said delay means for retaining, at a predetermined potential, the output signal of said comparing means during the delay period of said delay means.

* * * * *